United States Patent [19]

Ganesan et al.

[11] Patent Number: 4,651,133
[45] Date of Patent: Mar. 17, 1987

[54] METHOD AND APPARATUS FOR CAPACITIVE KEYBOARD SCANNING

[75] Inventors: Apparajan Ganesan, Lincroft, N.J.; Wayne A. Weise, Noblesville, Ind.

[73] Assignee: AT&T Technologies, Inc., Murray Hill, N.J.

[21] Appl. No.: 685,856

[22] Filed: Dec. 24, 1984

[51] Int. Cl.[4] .............................................. G06F 3/02
[52] U.S. Cl. ............................ 340/365 C; 340/365 R; 340/365 S
[58] Field of Search ............ 340/365 C, 365 S, 365 R, 340/825.79; 200/DIG. 1; 361/288, 299; 400/479.1; 178/17 C, 17 D, 18, 19; 179/90 K

[56] References Cited

U.S. PATENT DOCUMENTS

| T904,008 | 11/1972 | Crouse | 400/479.1 |
| 4,211,915 | 7/1980 | Miller | 371/15 |
| 4,305,135 | 12/1981 | Dahl | 364/900 |
| 4,405,917 | 9/1983 | Chai | 340/365 |
| 4,405,918 | 9/1983 | Wall et al. | 340/365 C |
| 4,414,538 | 11/1983 | Schnizlein | 340/365 |
| 4,539,554 | 9/1985 | Jarvis et al. | 340/365 C |

FOREIGN PATENT DOCUMENTS 0062572 10/1982 France ................................ 340/365

OTHER PUBLICATIONS

"Capacitive Keyboard FET Sense Circuit", *IBM Technical Disclosure Bulletin*, E. G. Crabtree, J. M. Sublette and D. R. Thomas, vol. 24, No. 5, Oct. 1981, pp. 2237-2240.

"Matrix Scanning Logic for a Capacitive Switching Keyboard", Computer Design (USA), John W. Volpe, vol. 12, No. 1, Jan. 1973, pp. 84-88.

*Primary Examiner*—John W. Caldwell, Sr.
*Assistant Examiner*—Mahmoud Fatahi-Yar
*Attorney, Agent, or Firm*—Volker R. Ulbrich

[57] ABSTRACT

A capacitive keypad (24) is scanned in such a manner that the capacitance value (C) of an individual key in a given row is multiplied by the sum of the relative capacitance values of all the other keys in the same row by means of an amplifier (32) to generate a combined pulse. The combined pulse is then compared by a comparator (28) to a threshold voltage (Vref 3) to verify whether the individual key in question is in the closed or open position. The verification can be made independently of keypad-to-keypad variations in the capacitances of the keys, since the combined pulse value does not depend upon the absolute capacitance value of the keys, but only upon their relative values. Also disclosed is a method for scanning to determine the presence of multiple key closures. This involves comparing the capacitance of an interrogated key to not only the sum of the other capacitors of its row, but also to the sum of the capacitors of the other rows and columns and a comparison of the resulting value to that generated by previous scans to detect change.

11 Claims, 2 Drawing Figures $VX = VREF2 - VREF1 * [C41/(C42+C43+C44)]$

METHOD AND APPARATUS FOR CAPACITIVE KEYBOARD SCANNING

TECHNICAL FIELD

The invention relates to the scanning of keys of a capacitive keypad for detecting and verifying their switching states.

BACKGROUND OF THE INVENTION

Keyboards are essential in user interface equipment of various types, including calculators, typewriters, computer terminals, and the like. An electronic keyboard in its most elemental form is simply an array of switches which may be operated by the user to convert physical motion to electrical signals. The switches may take various forms. Make-or-break mechanical contact switches become degraded by mechanical wear and contamination and, additionally, have a tendency toward "contact bounce." Attempts to avoid these problems have led to the development of capacitive switches. These involve a capacitance having one plate which is movable by depression of the key. The resulting change in the capacitance value is sensed to verify the key depression. A common way of sensing the capacitance value is to charge the capacitor by a current source to a reference voltage. The required time for the charging can be used to determine whether the capacitance value is high or low by comparing it to some reference value. For example, the reference value may be a reference capacitor charged by a similar current. The number of individual leads to the keys of a capacitive keyboard can be reduced by the use of key scanning techniques. These involve locating key closures by sensing the capacitance values of entire rows and columns of keys to identify closed keys at their common intersections. Examples of some capacitive keyboards and scanning techniques for them are described in the following:

U.S. Pat. No. 4,211,915, issued July 8, 1980 to D. E. Miller et al.

U.S. Pat. No. 4,305,135, issued Dec. 8, 1981 to J. P. Dahl et al.

U.S. Pat. No. 4,405,917, issued Sept. 20, 1983 to T. Y. Chai

U.S. Pat. No. 4,414,538, issued Nov. 8, 1983 to Schnizlein

"Matrix Scanning Logic for a Capacitive Switching Keyboard," by John W. Volpe, in Computer Design (USA) vol. 12, No. 1 84–88, Jan. 1973

"Capacitive Keyboard FET Sense Circuit," by E. G. Crabtree et al., in *IBM Technical Disclosure Bulletin*, Vol. 24, No. 5, Oct. 1981

One type of capacitive keyboard which is of particular interest commercially is the film, or membrane keypad, which is a laminated structure of two membranes. Each carries a printed circuit pattern separated by an insulating membrane containing a perforation associated with each key area. The circuit patterns of the membranes include mutually opposed capacitance plates registered with the perforations. The pressing of one of the circuit pattern membranes into a perforation results in an increased capacitance for the opposed plates.

A troubling aspect of the manufacture of membrane keypads is that variations in the thickness dimensions of the perforated insulating membrane or in the thickness of other insulating layers which might be present between the opposed capacitance plates result in significant changes in the values of the capacitances from one keypad to the next. As a result, it is necessary to adjust separately for each keypad the reference value to be used for verifying key closures. This adds considerably to the manufacturing cost of the product.

SUMMARY OF THE INVENTION

In accordance with the novel method and apparatus of the present invention, a capacitive keyboard is scanned in a manner in which the capacitance of a given key is compared to the capacitance of one or more other keys of the same kayboard. Verification of a key closure is determined by the relative capacitance values, rather than being dependent upon a reference value. The relative capacitance values remain substantially the same from keyboard to keyboard despite manufacturing variations, such as in the thickness of insulating layers for membrane keypads. In this way, the adjustment of a reference value for individual keyboards is made unnecessary for any variations in capacitances from one keyboard to the next.

DETAILED DESCRIPTION

Figure 1:
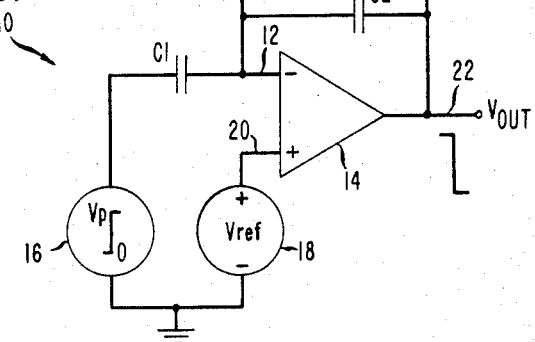
FIG. 1 is a schematic circuit diagram of a greatly simplified capacitive keypad arrangement in accordance with an embodiment of the present invention having only two keys.

The circuit of the keypad 10 of FIG. 1 illustrates the nature of the key closure process in accordance with the invention. Only two keys are present in the keypad 10. They are identified by their capacitances C1 and C2. The key C1 is connected between the inverting input port 12 of an operational amplifier 14 and a scanning pulse generator 16, which has its other side connected to ground potential. The key C2 is connected in parallel with a zeroing switch $S_0$ between the inverting input port 12 and the output port 22 of the amplifier 14. A voltage reference source 18 is connected between ground potential and the noninverting input port 20 of the amplifier 14. As the keypad 10 is configured, the key C1 is scanned by a pulse from the pulse generator 16. The output pulse which will result at the output port 22 of the amplifier 14 will have a magnitude of the inverse of the pulse from the pulse generator 16 times the ratio C1/C2. Thus it is seen that the magnitude of the reference voltage from the source 18 is not a significant factor in this value. The magnitude of the scanning pulse from the generator 16 can be readily made independent of ordinarily expected variations in power. The output of the amplifier 14, therefore, gives a capacitance ratio for the keys which can be compared to a reference value to determine whether the key C1 is closed. The reference value for the comparison can be the same for keypads with different values for their capacitances. So long as both the capacitances C1 and C2 are changed to the same degree, the ratio C1/C2 does not change. If it is now desired to scan the key C2, the keypad 10 must be reconfigured to effectively interchange the connections of C1 and C2, so that the capacitance of C2 is compared to that of C1. Such reconfiguration is readily accomplished by the provision of appropriate switches and controls.

Figure 2:
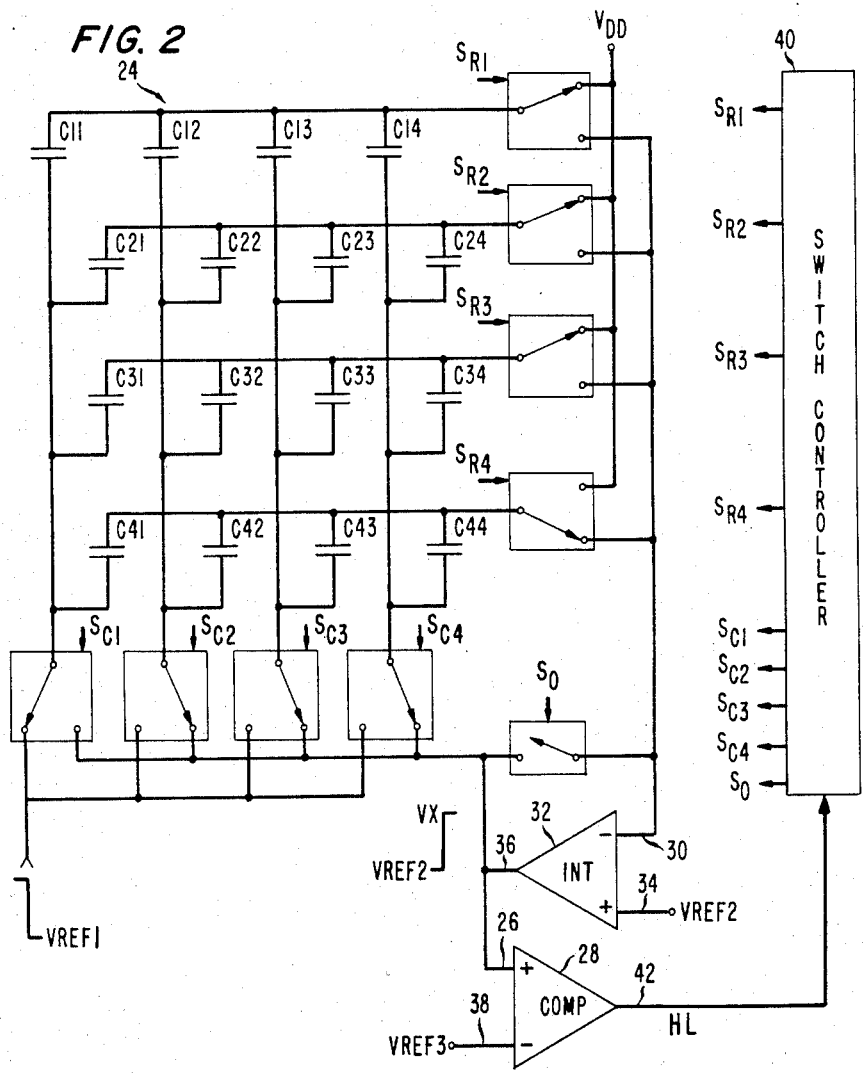
FIG. 2 is a simplified schematic circuit diagram of a capacitive keypad arrangement in accordance with another embodiment of the invention having several rows and columns of cross-point connected keys and showing the circuitry associated therewith for the closure verification process.

The circuit of the keypad 24 of FIG. 2 illustrates in more detail the scanning process of a keypad in accordance with the invention. The keys of the keypad 24 are identified by their associated capacitances. These are designated by "C" followed by a two digit number. The first digit indicates the row, and the second the column in which the key is located. A first side of all the capacitors in a particular column can be selectively connected to the source of an interrogation pulse of magnitude $V_{ref}1$ or, alternatively, to the noninverting input 26 of a comparator 28 by the action of a corresponding one of a set of toggle switches $S_{C1}$–$S_{C4}$ associated with the respective columns. A second side of all the capacitors in a particular row can be selectively connected to the inverting input port 30 of an operational amplifier 32 or, alternatively, to a positive supply voltage $V_{DD}$ by the action of a corresponding one of a set of toggle switches $S_{R1}$–$S_{R4}$ associated with the respective rows. The noninverting input port 34 of the amplifier 32 is connected to a second reference voltage $V_{ref}2$. The output port 36 of the amplifier 32 is connected to the noninverting input port 26 of the comparator 28. The inverting input port 38 of the comparator 38 is connected to a third reference voltage $V_{ref}3$. A zeroing switch $S_O$ is connected between the inverting input port 30 and the output port 36 of the amplifier 32.

The switches $S_{C1}$–$S_{C4}$, $S_{R1}$–$S_{R4}$, and $S_0$ are operated by a controller 40. They may take whatever form is most appropriate for the particular circuit implementation in question. For example, for an MOS circuit the switches are advantageously in the form of transmission gates. Controllers for operating the switches in whatever manner is suitable for their function are known to those in the art.

In the operation of the keypad 24, one capacitor of each row is compared with all the remaining capacitors of that same row. As the keypad 24 of FIG. 2 is configured, the value of C41 is being compared to the sum of the capacitors C42,C43,C44. The zeroing switch $S_0$ is initially closed to bring the inverting input port 30 of the amplifier 32 to the same voltage as the output port 36. Then the zeroing switch $S_0$ is opened and a pulse of magnitude $V_{ref}1$ below the reference voltage $V_{DD}$ is applied to the first sides of all the capacitors of the first column. At this time the first sides of the capacitors of the remaining columns are connected to the noninverting input port 26 of the comparator 28. Also at this time, the other sides of the capacitors of the fourth row are connected to the inverting input port 30 of the amplifier 32, while the other sides of the capacitors of all the other rows are connected to the positive supply voltage $V_{DD}$. It is reasonable to assume the loop gain of the amplifier 32 to be sufficiently high to prevent the sum of the capacitances from the other sides of the capacitors of all the other rows from adversely affecting its output. The output of the amplifier is a pulse of magnitude $V_x$ above $V_{ref}2$, which can be expressed as $V_{ref}2 - V_{ref}1 * C41/(C42+C43+C44)$. The output $V_x$ is then compared to a key closure threshold reference voltage $V_{ref}3$ by the comparator 28 to result in an output HL at the output port 42 of the comparator 28.

If the next key to be scanned is C42, then the switches $S_{C1}$ and $S_{C2}$ are changed to their alternate positions and the pulsing process is repeated. In this manner the entire keypad 24 can be scanned, and the condition of each key can be determined and verified by the reference voltage $V_{ref}3$ comparison with accuracy, regardless of mass variations in the values of the capacitances of the keys, since the variable parameter for determining closure is independent of a reference voltage level.

While in the keypad 24 the key C41 of interest is compared to the other remaining keys in its row, it could also be compared to any one or more other keys on the keypad and still be within the scope of the invention if the comparison is accomplished by only a single scanning pulse for each key. However, comparison to the other keys of the row is advantageous in that it requires a minimum amount of switching for the scanning process.

A particularly advantageous logic sequence for scanning the keypad 24 is to continue to scan a key which has been detected as being in the closed position until it is detected as being open once again. The effects of errors resulting from noise or key bounce can be reduced by requiring multiple successive detections of either the closed or open position of the key to be made before verification of that condition is considered established.

The above scanning procedure for the keypad 24 is for detecting individual key closures, and does not detect multiple key closures. For detecting multiple key closures, the basic operation is similar to that described above, except that each key is compared to the additional row, then column keys. A detection in either comparison results in the continual scanning of the key until 3 successive scans verify the key closure. Once the key being interrogated is verified as being either open or closed, the keypad scan is resumed. At the time of validation, the row-column information is compared to a second stage of information and this comparison is used to enable the generation of key closures independently. The keypad information is then transferred to the second stage for further comparisons.

Although the present invention is particularly advantageous for membrane keypads, it is applicable to any capacitive keyboard in which there are variations in the values of the key capacitances from one keyboard to the next.

What is claimed is:

1. A method of determining the switched state of one of a plurality of key capacitors in rows and columns of a capacitive keyboard, comprising the steps of:
    applying an interrogating pulse to one side of the one key capacitor in one row and at the same time also to one side of at least one other key capacitor of the keyboard; then,
    sensing the resulting response pulse at the other side of the one key capacitor and multiplying it by the resulting response pulse at the other side of the other key capacitors to obtain a combined pulse; and then,
    comparing the combined pulse to a reference threshold to generate a logic output which indicates whether the one key is closed.

2. The method defined in claim 1 wherein the interrogating pulse is applied to all the other key capacitors in the one row.

3. The method defined in claim 2, comprising also the step of comparing the combined pulse resulting from the detection of the one key of the one row to the combined pulses of the detection of the other rows and columns.

4. The method defined in claim 3 wherein the additional step includes comparing the logic output resulting from the detection of the one key of the one row to the logic output resulting from the detection of all the keys in another row.

5. The method defined in claim 4 wherein the other row is adjacent the one row.

6. The method defined in claim 5 comprising scanning the one key at least three times in succession to verify its closure.

7. The method defined in claim 6 comprising scanning the one key at least three times in succession to verify its return to the open condition.

8. The method defined in claim 7 wherein the comparing of the additional step is to a logic output stored as a result of the detection of all the keys of all the rows and columns.

9. A capacitive keyboard of the type having a plurality of key capacitors organized in an array of rows and columns and means for electronically scanning said capacitors to generate a logic output indicative of the switching condition of the capacitors, The improved scanning means therein comprising:

an operational amplifier having first and second input nodes and an output node, the first input node being connected to a first reference potential node;

a comparator having first and second input nodes and an output node, the first input node being connected to the output node of the amplifier and the second input node being connected to a second reference potential node;

first switching means for selectively connecting one side of any one of the capacitors of one of the rows alternately to an interrogating pulse source node and to the first input node of the comparator;

second switching means for selectively connecting the other side of any one of the capacitors of the one row alternately to the second input node of the operational amplifier and to a supply voltage node;

third switching means for periodically connecting the second input node of the amplifier to the output node of the amplifier, and control means having an input node connected to the output node of the comparator for operating the first and second switching means.

10. The apparatus defined in claim 9 wherein the capacitors are cross-point connected.

11. The apparatus defined in claim 10 wherein the first switching means selectively connects the one side of all the capacitors in a given column to the pulse source node or to the first input node of the comparator, and wherein the second switching means selectively connects the other side of all the capacitors in a given row to the second input node of the amplifier or to the supply voltage node.

* * * * *